(12) United States Patent
Lin et al.

(10) Patent No.: US 6,356,431 B1
(45) Date of Patent: Mar. 12, 2002

(54) CONNECTION PINS OF A CAPACITOR

(76) Inventors: Ming Chang Lin; Su-Chin Lai, both of P.O. Box 82-144, Taipei (TW)

( * ) Notice: Subject to any disclaimer, the term of this patent is extended or adjusted under 35 U.S.C. 154(b) by 0 days.

(21) Appl. No.: 09/816,350

(22) Filed: Mar. 26, 2001

(51) Int. Cl.[7] .......................... H01G 4/236; H01G 2/10; H01G 4/228
(52) U.S. Cl. ................. 361/307; 361/308.1; 361/309; 361/301.3; 361/517; 361/520; 361/535; 361/538
(58) Field of Search .............................. 361/272, 301.3, 361/306.1, 308.1, 329, 309, 517–520, 535–540; 174/52.4

(56) References Cited

U.S. PATENT DOCUMENTS

| | | | | |
|---|---|---|---|---|
| 4,250,534 A | * | 2/1981 | Brown et al. | 361/272 |
| 5,548,473 A | * | 8/1996 | Wang | 361/301.1 |
| 5,978,203 A | * | 11/1999 | Kiyomura et al. | 361/301.3 |
| 6,118,646 A | * | 9/2000 | Yang et al. | 361/301.3 |
| 6,233,133 B1 | * | 5/2001 | Weng | 361/301.3 |

* cited by examiner

Primary Examiner—Anthony Dinkins
(74) Attorney, Agent, or Firm—A & J

(57) ABSTRACT

A structure of connection pins of a capacitor includes a housing, connection pins positioned at the lateral sides of the interior of the housing, and a capacitor element located between two pins, and the remaining space of the housing being filled with fixing glue, characterized in that one opening of the housing holds the capacitor element at a larger surface thereof and the two pins are located at the sides of the housing a plurality of elastic plates with a slanting angle are provided to the connection pins, and the lower section of the connection pins are bent to form a contact plate for contacting with a circuit board, the contact plate is a hook-like structure and is provided with solder at appropriate position, an insertion leg is provided on the contact plate for mounting with the circuit board, thereby the elastic plate clips the capacitor element to provide a good position and stable contact.

4 Claims, 5 Drawing Sheets

CONNECTION PINS OF A CAPACITOR

BACKGROUND OF THE INVENTION (a) Field of the Invention

The present invention relates to a connection pins of a capacitor, and in particular, connection pins allowing rapid mounting onto a circuit board and reducing the height of the capacitor on the circuit board.

(b) Description of the Prior Art

FIGS. 1 and 2 show a conventional low power capacitor having a smaller capacity and being mounted onto the circuit board 1 of electrical appliances. The capacitor comprises a housing 2, two connection pins 3, a capacitor element 4 and fixing glue 5.

The housing 2 is a rectangular plastic housing body having an opening at one side, and the inner wall of the two sides of the housing 2 being circular arch-shaped protruded plate 20 having two opened ends such that a conductive slot 21 is formed for the mounting of the connection pins 3.

Two connection pins 3 has an upper section soldered at the two lateral sides of the capacitor element 4, and the connection pins 3 is bent at an appropriate position to form an engaging section 30 for mounting at the conductive slot 21 so as to position the capacitor element 4 at the center of the housing 2, and to allow fixing glue 5 to fully enclose the external of the capacitor element 4 so as to avoid explosion as a result of high voltage and to prevent oxidation of the capacitor element 4 with the air.

The capacitor element 4 is mounted within the interior of the housing 2 and has a plurality of oval shape metal-coated layers and films stacked to form an oval-shaped structure. The two lateral sides are ordered with two connection pins 3.

The fixing glue 5 is filled all the space within the housing 2 other than the capacitor element 4 and the connection legs 3 so as to enclose the capacitor 4 to avoid the explosion of the capacitor element 4 due to excessive voltage or the avoid oxidation as a result of prolong air contact of the capacitor element 4 with air.

The disadvantages of the conventional capacitors are as follows:
1) The manufacturing process is complicated and the defect products are high.
2) The soldering process may damage the circuit board.
3) The process of installation onto the circuit board is complicated.
4) The installation of the capacitor takes up space.
5) The formation of soldering holes is difficult.

Another conventional high power capacitor is disclosed in Taiwan Publication no. 98458 comprising a cover 1, a capacitor element 2, two conductive spring plates 3, a fixing plate 4 and a housing body 5. The capacitor element 2 is mounted to the housing body 2 by means of a plurality of elastic plates 3 of the conductive spring plate 3. There is not soldering between the conductive plates 3 and the capacitor element 2. Due to the fact that no fixing glue is used and therefore the mounting of the capacitor element 2 is poor.

SUMMARY OF THE INVENTION

Accordingly, it is an object of the present invention to provide connection pins of a capacitor, which provides rapid mounting of the capacitors onto a circuit board so as to increase working efficiency.

Yet another object of the present invention is to provide connection pins of a capacitor, wherein the height of the connection pins on the circuit board are greatly reduced.

An aspect of the present invention is to provide a structure of connection pins of a capacitor, comprising a housing, connection pins positioned at the lateral sides of the interior of the housing, and a capacitor element located between two pins, and the remaining space of the housing being filled with fixing glue, characterized in that one opening of the housing holds the capacitor element at a larger surface thereof and the two pins are located at the sides of the housing a plurality of elastic plates with a slanting angle are provided to the connection pins, and the lower section of the connection pins are bent to form a contact plate for contacting with a circuit board, the contact plate is a hook-like structure and is provided with solder at appropriate position, an insertion leg is provided on the contact plate for mounting with the circuit board, thereby the elastic plate clips the capacitor element to provide a good position and stable contact.

The foregoing object and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PRESENT INVENTION

Figure 1:
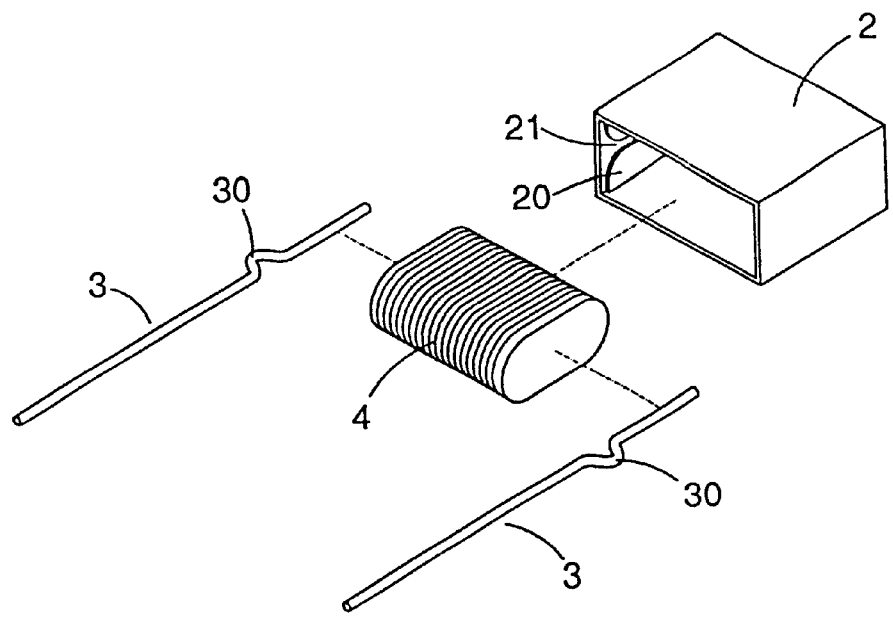
FIG. 1 is a perspective exploded view of a conventional capacitor structure.
Figure 2:
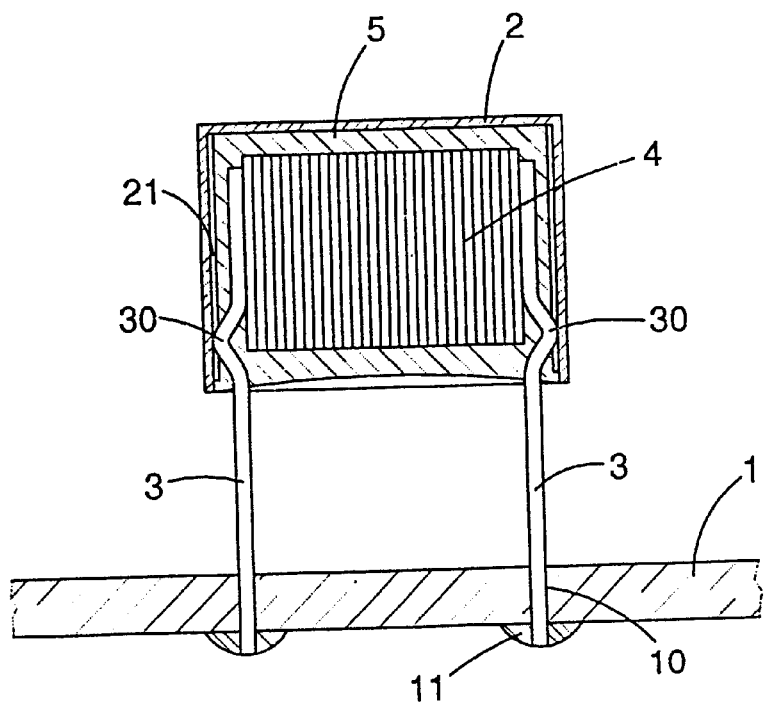
FIG. 2 is a sectional view of the conventional capacitor shown in FIG. 1
Figure 3:
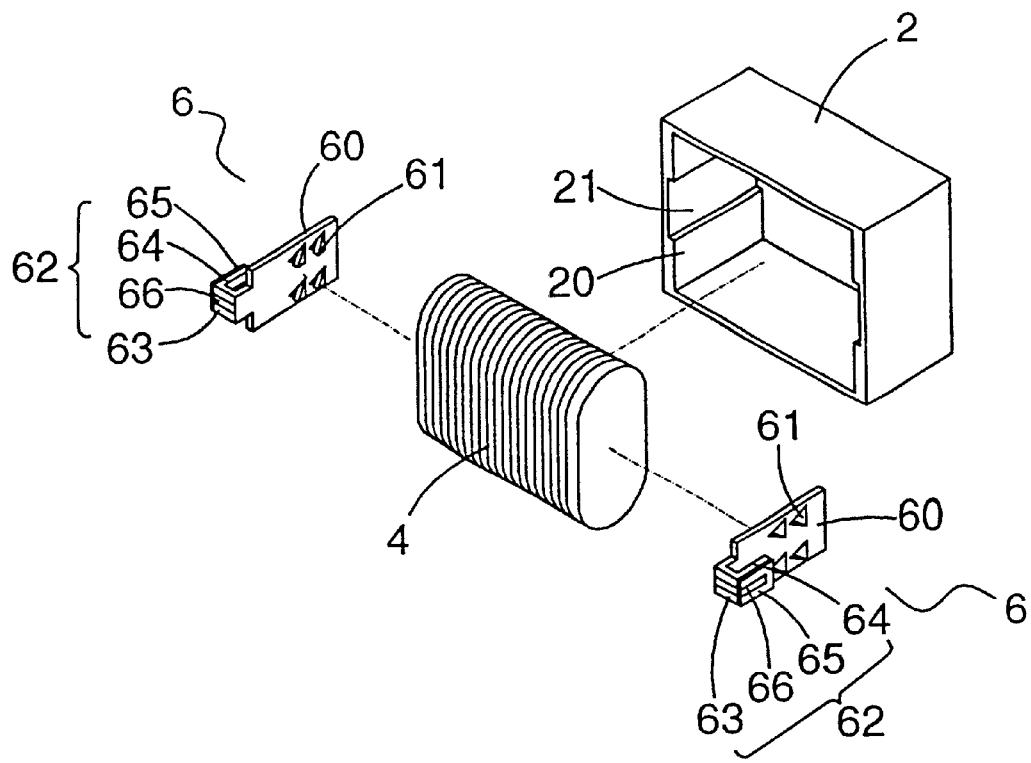
FIG. 3 shows a perspective exploded view of connection pins of a capacitor of the present invention.
Figure 4:
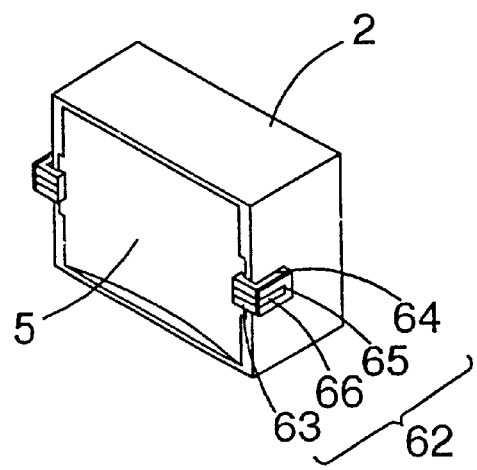
FIG. 4 shows the mounting of the connection legs of the capacitor of the present invention.
Figure 5:
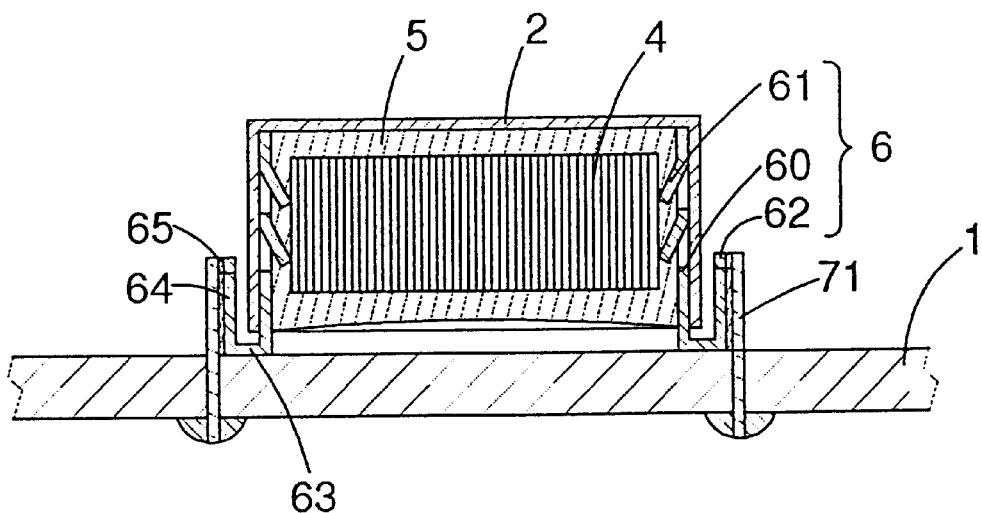
FIG. 5 is a sectional view showing the mounting of the capacitor onto a circuit board in accordance with the present invention.
Figure 6:
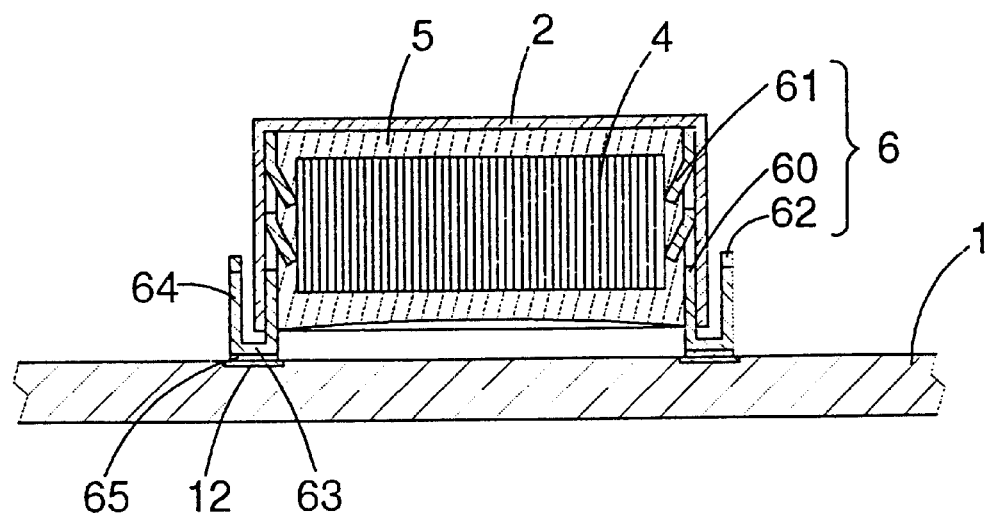
FIG. 6 is a sectional view showing the mounting of the capacitor onto the circuit board of the present invention.

Referring to FIGS. 3 to 5, there is shown an improved structure of a capacitor pins comprising a housing 2, two connection pins 6, a capacitor element 4 and fixing glue 5.

The housing 2 is a rectangular plastic housing body having an opening at one side, and the inner wall of the two sides of the housing 2 being circular arch-shaped protruded plate 20 having two opened ends such that a conductive slot 21 is formed for the mounting of the connection pins 6.

Two connection pins 6 are located at the two lateral sides of the capacitor element 4 and are made of copper plate 60. A plurality of protruded elastic plates 61 are formed on the copper plate 60, allowing the mounting together with the capacitor element 4 but the lateral sides thereof onto the center of the interior of the housing 2. The lower section of the copper plate 60 is a outward bent contact plate 62 and the contact plate 62 is provided with a layer of solder 65 such that a hot air can be used to solder the circuit 12 of the circuit board 1 wit the capacitor. The contact plate 62 is a copper plate 60 having a lower end protruded out to form a horizontal plate 63. The external end of the horizontal plate 63 is bent and upright to form an upright plate 64. The contact plate 62 is provided with small size insertion leg 66 of for mounting with conventional circuit board.

The capacitor element 4 is mounted within the interior of the housing 2 and has a plurality of oval shaped metal-coated layers and films stacked to form an oval-shaped structure.

The fixing glue 5 is filled in all the space within the housing 2 other than the capacitor element 4 and the connection legs 3 so as to enclose the capacitor 4 to avoid the explosion of the capacitor element 4 due to excessive voltage or the avoid oxidation as a result of prolong air contact of the capacitor element 4 with air.

The capacitor element 4 is mounted within the housing 2 and consists of a plurality of oval shape metal-coated layers and thin films stacked together forming a oval-shape structure. The fixing glue 5 is filled in other space between the capacitor element 4 and the connection pins 3 to enclose the capacitor element 4 to prevent capacitor element 4 from explosion as a result of high voltage or to prevent the capacitor element 4 to prolong contact with the air.

Referring to FIG. 3, in the course of installation of the capacitor, the copper plate 60 of the two connection pins 6 is pressed against the two sides of the capacitor elements 4 such that the elastic plate 61 of the two copper plate 60 will deform and urge against the two lateral sides of the capacitor element 4. After that, the capacitor element 4 is placed within the housing. Thus the elastic plate 61 will urge against one side of the interior of the housing 2 and the elasticity will clip the capacitor element 4 at the center of the interior of the housing 2. Finally, the housing 2 is filled with fixing glue 5 to enclose the capacitor element 4.

Referring to FIGS. 4 and 5, during the course of fixing the capacitor onto the circuit board 1, the bottom section of a horizontal plate 63 of the capacitor or the external side of an upright plate 64 is provided with a layer of solder 65, and the solder 65 is pressed against the lead leg 71 of the circuit board or on the circuit 12 and a hot air is used to blow the solder 625 together with the lead leg 71 or the contact of the circuit 12. The solder 65 will nelt and the contact plate 62 will be directly mounted onto the lead leg 71 of the circuit board 71 or the circuit 12. Thus the capacitor is fixed onto the circuit board 1.

Figure 7:
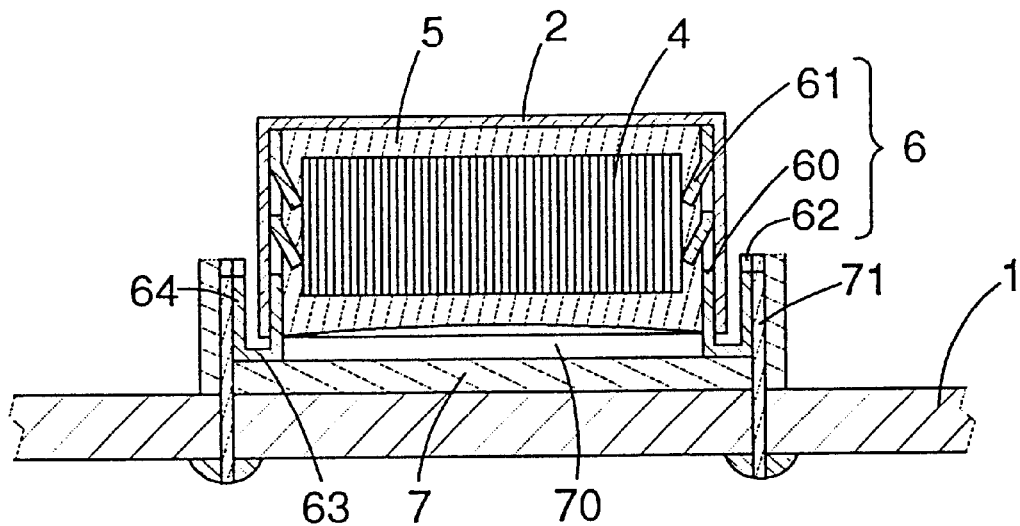
FIG. 7 shows the mounting of the capacitor onto the circuit board in accordance with the present invention.
Figure 8:
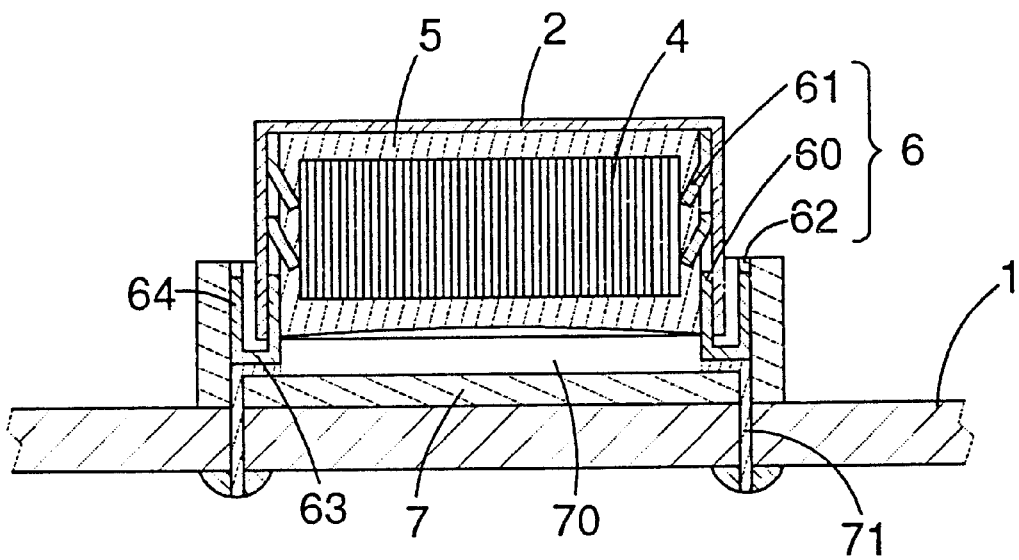
FIG. 8 shows the mounting of the capacitor onto the circuit board with an insertion seat thereon in accordance with the present invention.

Referring to FIGS. 7 and 8, an insertion seat 7 is provided on the circuit board 1 and the capacitor of the present invention can be mounted thereto by via of the insertion leg. The insertion seat 7 is provided with an insertion slot 70 and the slot 70 is corresponding to the connection leg 6 of the capacitor and is in upright position or is corresponding to the 90 degree bent lead leg 71. The bottom end of the lead leg 7 is soldered to the circuit board 1.

Figure 9:
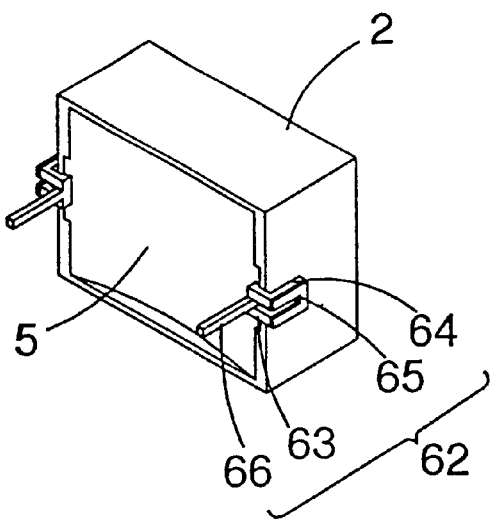
FIG. 9 is a perspective view showing the connection pins being in upright position in accordance with the present invention.
Figure 10:
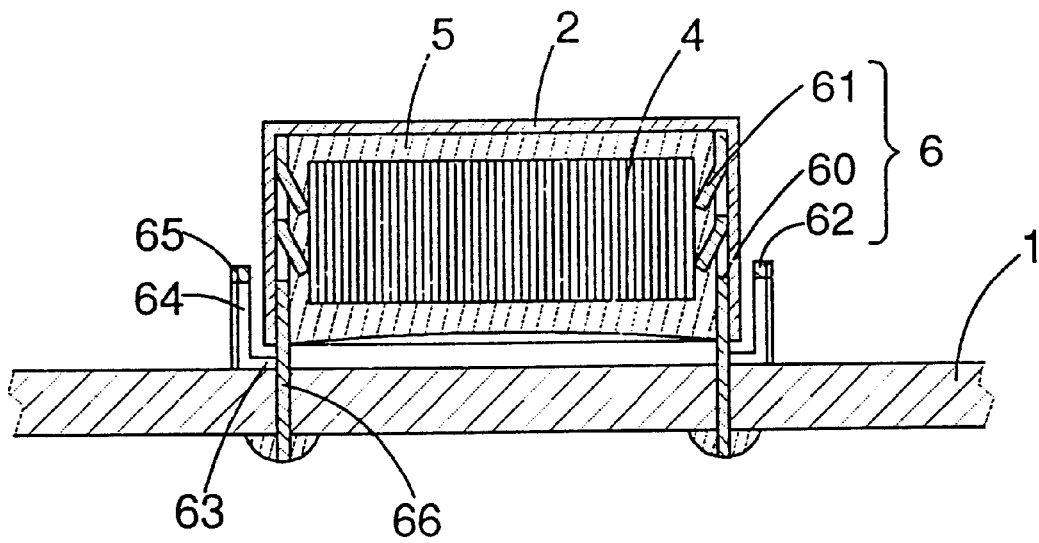
FIG. 10 is a sectional view showing the mounting of the capacitor onto the circuit board in accordance with the present invention.

Referring to FIGS. 9 and 10, the insertion leg 66 of the two contact plate is in upright position for vertical insertion onto conventional circuit board.

In accordance with the present invention, the advantages are as follows:

1) The manufacturing process is simple and the defect products are minimized. The elastic plate 61 will auto-matically clip the capacitor element 4 at the center of the interior of the housing 2, and the 90 soldering process is required and therefore, the capacitor element will not be affected by temperature.

2) Stable product. The two copper plates 60 are pressed and positioned by a plurality of elastic plates 61, thus, the contact between the capacitor element 4 and the elastic plates 61 is stable.

3) Rapid installation on the circuit board. The contact plate 62 of the connection pins 6 is provided with a solder 65, and the solder 65 can be easily mounted with the lead leg 71 on the circuit board 1 or with the circuit 12. Therefore, the connection of the capacitor onto the circuit board is rapid.

4) Save space. As the height of the present capacitor is slightly higher than the housing 2, therefore, the entire capacitor will not occupy too much space on the circuit board.

5) No soldering hole is required. As the present capacitor employs the prefabricated solder 65 to mount onto the circuit 12, therefore, no soldering hole is required.

6) The capacitor can be mounted onto conventional circuit board. As an insertion leg 66 is provided on the contact plate 62, therefore, the capacitor of the present invention can be mounted onto conventional circuit board.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

We claim:

1. A structure of connection pins of a capacitor comprising a housing, connection pins positioned at the lateral sides of the interior of the housing, and a capacitor element located between two pins, and the remaining space of the housing being filled with fixing glue, charted in that one opening of the housing holds the capacitor element at a larger surface thereof and the two pins are located at the sides of the housing a plurality of elastic plates with a slanting angle are provided to the connection pins, and the lower section of the connection pins are bent to form a contact plate for contacting with a circuit board, the contact plate is a hook-like structure and is provided with solder at appropriate position, an insertion leg is provided on the contact plate for mounting with the circuit board, thereby the elastic plate clips the capacitor element to provide a good position and stable contact.

2. A structure of connection pins of a capacitor as set forth in claim 1, wherein an insertion seat is mounted onto the circuit board for the mounting of the capacitor thereon.

3. A structure of connection pins of a capacitor as set forth in claim 1, wherein the insertion seat has an upward opened slot for the holding of the capacitor and an interior of the insertion slot is provided with two lead pins corresponding to the connection legs of the capacitor and the bottom end of the lead legs is soldered to the circuit board.

4. A structure of connection pins of a capacitor as set forth in claim 1, wherein the elastic plates are protruded plates formed on the external surface of a copper plate.

* * * * *